United States Patent [19]

Spierings et al.

[11] Patent Number: 5,744,283
[45] Date of Patent: Apr. 28, 1998

[54] METHOD OF PHOTOLITHOGRAPHICALLY METALLIZING AT LEAST THE INSIDE OF HOLES ARRANGED IN ACCORDANCE WITH A PATTERN IN A PLATE OF AN ELECTRICALLY INSULATING MATERIAL

[75] Inventors: Gijsbertus A.C.M. Spierings; Willem L.C.M. Heijboer; Leo O. Remeeus, all of Eindhoven, Netherlands

[73] Assignee: U.S. Philips Corporation, New York, N.Y.

[21] Appl. No.: 566,779

[22] Filed: Dec. 4, 1995

Related U.S. Application Data

[63] Continuation-in-part of Ser. No. 419,588, Apr. 7, 1995, abandoned.

[30] Foreign Application Priority Data

Apr. 12, 1994 [EP] European Pat. Off. ............ 94200976.2

[51] Int. Cl.$^6$ ............................................. G03F 7/00
[52] U.S. Cl. ............................ 430/313; 430/318; 430/329
[58] Field of Search ................................. 430/311, 313, 430/318, 319, 323, 329

[56] References Cited

U.S. PATENT DOCUMENTS

| | | | |
|---|---|---|---|
| 4,008,084 | 2/1977 | Ikeda | 430/311 |
| 4,673,458 | 6/1987 | Ishikawa | 156/659.11 |
| 5,415,749 | 5/1995 | Hamilton | 204/181.6 |

FOREIGN PATENT DOCUMENTS

| | | |
|---|---|---|
| 0464937A1 | 1/1992 | European Pat. Off. . |
| 0539714A1 | 5/1993 | European Pat. Off. . |
| 0562670A1 | 9/1993 | European Pat. Off. . |

*Primary Examiner*—Kathleen Duda
*Attorney, Agent, or Firm*—Norman N. Spain

[57] ABSTRACT

Method of photolithographically metallizing at least the inside of holes arranged in accordance with a pattern in a plate of an electrically insulating material.

A method of metallizing an electrically insulating plate, for example, of glass, having a large number of holes. Said holes are internally provided with a metal layer and the plate is provided with metal tracks. The metal used is mainly aluminium. The aluminium is coated with a thin protective layer of chromium, cobalt, nickel, zirconium or titanium. Said protective layer makes it possible to use a photosensitive, electrophoretic lacquer for providing the metal layer with a structure. The method can very suitably be used for the manufacture of selection plates for thin electron displays.

11 Claims, 1 Drawing Sheet

METHOD OF PHOTOLITHOGRAPHICALLY METALLIZING AT LEAST THE INSIDE OF HOLES ARRANGED IN ACCORDANCE WITH A PATTERN IN A PLATE OF AN ELECTRICALLY INSULATING MATERIAL

This is a continuation-in-part of application Ser. No. 08/419,588, filed Apr. 7, 1995, now abandoned.

BACKGROUND OF THE INVENTION

The invention relates to a method of photolithographically metallizing at least the inside of holes arranged in accordance with a pattern in a plate of an electrically insulating material, while using a negative, photosensitive, electrophoretic lacquer coating.

Such perforated plates, for example, of glass, quartz glass, synthetic resin or a ceramic material are used, in particular, in field-emission displays and thin electron displays, the metallized holes serving as electrodes to control the electron currents moving towards the luminescent screen provided with phosphors and the electron currents in plasma displays. The surface of such a plate also comprises narrow metal tracks which are used to drive (address) the electrodes. In such displays, the plates are used as a control or selection plate. Thin electron displays comprise at least two selection plates.

Such a thin electron display is described in European Patent Application EP-A-464937, filed by Applicants. The display described therein comprises, inter alia, a preselection plate and a fine selection plate. These plates are, for example, made of glass and have a thickness of 0.5 mm. Such a plate comprises a very accurate pattern of holes, for example 400,000 holes having a diameter of 400 µm. In and around said holes there are provided metal selection electrodes which can be individually activated by means of narrow metal tracks on the glass plate. In said Patent Application no information is given as to which metal is used as the electrode nor how the metal is provided in and around the holes.

In European Patent Application EP-A-539714, there is disclosed an electrophoretic method of manufacturing copper patterns on printed circuit boards by using a negative, photosensitive, electrophoretic lacquer. Said lacquer may be of the cataphoretic or anaphoretic type. A substrate, for example, of epoxy to which a copper layer is uniformly applied is immersed in a solution of such a lacquer, the substrate and an inert electrode, for example, of stainless steel being connected to an external current source. If a cataphoretic lacquer is used, the copper layer on the substrate serves as the cathode and the inert electrode as the anode, i.e. the copper layer is electrically connected to the negative pole of the current source. The solution of the cataphoretic lacquer comprises, inter alia, a mixture of a polymer comprising positively charged groups, unsaturated monomers and a photoinitiator. Examples of positively charged groups are the amino group, quaternary ammonium group, sulphonium group and sulphoxonium group. These groups are neutralized by a water-soluble organic carboxylic acid, such as acetic acid, thereby forming micelles of approximately 100 nm in size. The electric field in the solution causes the positively charged mixture to be attracted towards the negatively charged copper layer where it is discharged. In addition, a strongly alkaline medium is formed near the cathode as a result of the electrolysis of water. The micelles become unstable and precipitate on the cathode. This results in the formation of a dense and uniform lacquer coating on the copper layer. Such an electrophoretic lacquer must be used to provide three-dimensional structures, such as internally metallized holes. The photosensitive lacquer is of the negative type, i.e. exposed parts of the lacquer coating become less soluble in a developing liquid than unexposed parts as a result of a photochemical reaction. Exposure often takes place through a photomask. Said difference in solubility enables the lacquer coating to be selectively removed. The lacquer pattern formed serves as a mask for an etching agent, so that the copper layer is structured to form a desired pattern which corresponds to the photomask used.

A disadvantage of said state-of-the-art method is that copper cannot be used as a metal track or electrode in thin electron display because of undesirable interactions with the electroluminescent phosphors used.

The metal tracks of the selection plates, for example, have a width of only 80 µm and a thickness of 5 µm. Under operating conditions, metal tracks having such a small cross-section lead to an enormous ohmic drop, for example, for a distance of 40 cm if an electrically ill-conducting metal is used. Examples of electrically well-conducting metals are copper and silver. Copper is unsuitable because of the above-mentioned disadvantage; silver is unattractive because it is expensive. It should be borne in mind that in order to obtain the desired pattern, the major part of the metal layer is removed by means of an etchant.

As aluminum exhibits a good electrical conductivity and a high vapour-deposition or sputtering rate, it can be used as the metal for, in particular, the metal tracks and the electrodes. It has however been found that aluminum is attacked in the known solutions of electrophoretic lacquers. If aluminum is brought into contact with a solution of an electrophoretic lacquer, gas bubbles form at the surface of the aluminum and the aluminum is dissolved in the lacquer solution. As a result, the cataphoretic lacquer coating is deposited in such a large thickness that the light used in the photolithographic step is absorbed to a substantial degree. Exposure of the lacquer coating throughout its thickness and complete curing then becomes problematic, resulting in a poor-quality photolithographic process. In addition, when the lacquer coating is provided, the gas bubbles partially dissolve in the lacquer coating, thereby forming undesirable pinholes in the lacquer coating.

SUMMARY OF THE INVENTION

It is an object of the invention to provide, inter alia, a reliable method of applying a metal coating to the walls of the holes and, preferably, also around the holes of the plate described hereinabove. The metal coating must adhere well to the plate, in particular a glass plate, and be sufficiently electroconductive for use in the narrow metal tracks on the plate, which connect the selection electrodes to the connecting contacts along the periphery of the plate.

These objects are achieved by a method as described in the opening paragraph, said method in accordance with the invention comprising the following steps:
 providing a chromium layer on at least one surface of the plate and on the walls of the holes,
 providing an aluminum layer on the chromium layer,
 providing the aluminum layer with a metal layer, the metal being selected from the group formed by chromium, cobalt, nickel, zirconium and titanium, or from an alloy of two or more of said metals,
 electrophoretically providing the negative, photosensitive, electrophoretic lacquer coating on the metal layer, exposing the lacquer coating in accordance with a pattern, thereby forming exposed and unexposed portions of the lacquer coating, exposed portions being formed at least in the holes, developing the lacquer coating, so that the metal layer underneath the unexposed portions of the lacquer layer is uncovered, removing the uncovered metal layer and the underlying aluminum and chromium layers to the surface of the plate by means of etching, while preserving the metal, chromium and aluminum layers underneath the exposed portions of the lacquer coating, stripping the lacquer coating of the exposed portions.

On account of the price and the dimensional accuracy and stability, the plate is preferably made of glass, but may alternatively be made of a ceramic or synthetic resin material. The thickness of the glass plate is, for example, 0.5 mm. The holes can be made in the plate by exposing the plate via a mask to a stream of abrasive powder particles, for example, of aluminium oxide. This method is described in European Patent Application EP-A-562670 (PHN 14.374), filed by Applicants. The holes are, for example, circular in section. Dependent upon the application of the plate, the diameter of the holes ranges from 50 µm to 5 mm. The holes formed are slightly conical, which is advantageous to the subsequent metallization of the holes.

At least one side of the plate is provided with a chromium layer. In this process, also the walls of the holes are provided with a chromium layer. Said chromium layer has a thickness, for example, of 10 nm and serves as a bonding layer for the aluminum layer to be subsequently provided.

An aluminum layer having a thickness, for example, of 5 µm is provided on the chromium layer. Because of its high evaporation or sputtering rate, aluminum can advantageously be provided by vacuum evaporation or sputtering. Aluminum is chosen because it has a high electrical conductivity and it does not have the above-mentioned disadvantages of copper and silver. The chromium layer is preferably also provided by vacuum evaporation or sputtering. Both metals can be provided one after the other by means of the same vacuum deposition system. In the vacuum evaporation or sputtering process, the surface of the plate having the largest diameter of the conical holes faces the evaporation source or sputter target. This results in said surface of the plate and the walls of the holes being coated, in succession, with a chromium layer and an aluminum layer. For certain applications, both sides of the plate are metallized.

The aluminum layer is subsequently provided with a layer of a metal selected from the group formed by chromium, nickel, zirconium and titanium, or an alloy of two or more of said metals. Unlike aluminum, these metals are not attacked by the customary, photosensitive, etectrophoretic lacquers. In addition, these metals form a sealing oxide layer during further processing of the plates into a display in an oxygen-containing atmosphere at temperatures up to 450° C. Under these circumstances, non-sealing oxide layers, such as those of iron, would lead to a completely corroded metal layer. The thickness of this metal layer is, for example, 50 nm. Because of the simplicity of the process, the metal used for the layer is preferably chromium. Also this metal layer is preferably provided by vacuum evaporation or sputtering.

The metallized plate is subsequently immersed in a bath comprising a negative, photosensitive, electrophoretic lacquer. Said lacquer may be of the cataphoretic or anaphoretic type. Such lacquers are commercially available and generally comprise a solvent, a polymer with positively charged groups if the lacquers are of the cataphoretic type and negatively charged groups if the lacquers are of the anaphoretic type, a photoinitiator and unsaturated monomers. Such a lacquer is described in the above-mentioned European Patent Application EP-A-539714. The cataphoretic lacquer described therein is composed, for example, of an aqueous solution of a polyaminoacrylate, diethoxy acetophenone as the photoinitiator and butyl methacrylate monomers. The metallized plate is galvanically connected to the negative pole of an external current source and serves as the cathode. The bath also comprises a plate or rod of an inert material, such as platinum or stainless steel, which serves as the anode and which is connected to the positive pole of the current source. A DC voltage, for example, of 100 V is applied across the cathode and the anode. After a short period of time, for example thirty seconds, a photosensitive lacquer layer is deposited on the metallized plate. The plate is subsequently removed from the bath, rinsed with water and dried. Electrophoretic provision of the lacquer layer ensures that said layer is provided in a uniform thickness on the entire plate and on the walls of the holes. To preclude a sticky surface, the lacquer layer may optionally be provided with a top coating. For this purpose, use can be made of coating solutions specified by the supplier of the electrophoretic lacquer, for example solutions on the basis of hydroxy cellulose. By virtue of such a top coating, it is precluded, inter alia, that the lacquer layer sticks to the photomask in the subsequent exposure step.

Owing to the presence of unsaturated monomers, the composition of the electrophoretic lacquer is such that exposure to actinic radiation results in the formation of a crosslinked network of polymers. As there is a large choice of UV-sensitive photoinitiators and exposure means, such as UV-lamps and masks, use is preferably made of UV-light, for example originating from a mercury-vapour lamp emitting light having a wavelength of 365 nm, for exposure of the lacquer coating in accordance with a pattern. Patterned exposure preferably takes place through a photomask, which is provided on the lacquer coating. In this case, the lacquer coating is preferably provided with the above-mentioned top coating to preclude sticking of the photomask to the lacquer coating. The photomask may optionally be placed at a short distance from the lacquer coating. By virtue thereof, damage to the photomask and/or the lacquer coating as well as undesired adhesion of the photomask to the sticky lacquer coating are precluded, however, the resolution is adversely affected. The photomask used only transmits UV-light in those places where the metal tracks are to be provided on the surface of the plate and where the metal electrodes are to be provided in the holes. Preferably, a narrow edge around the holes is also exposed because of the ultimately desired electrode shape.

After exposure, the lacquer coating is developed by means of a developing liquid. For this purpose, use is often made of an aqueous alkaline solution of NaOH or $Na_2CO_3$, an aqueous lactic acid solution or a developing agent specified by the supplier of the photosensitive electrophoretic lacquer. In this process, the unexposed portions of the lacquer coating are removed and the underlying metal layer is uncovered. Following said developing process, the plate is rinsed with water.

The uncovered metal layer and the underlying aluminium and chromium layer are removed by means of well-known etching agents for these metals. Chromium and aluminium can, for example, be etched with an alkaline solution of $K_3Fe(CN)_6$. The plate is subsequently rinsed with water.

The exposed portions of the lacquer coating are subsequently stripped off. For this purpose, use can be made of an alkaline solution as specified by the supplier of the electrophoretic lacquer. The lacquer can also be stripped off by means of an oxygen plasma.

When use is made of commercially available stripping solutions, the electrophoretic lacquer coating cannot be removed without residue from some metal surfaces, such as chromium and aluminium layers. A small quantity of the lacquer coating remains on the metal surface, which is undesirable for the further processing of the plates. A suitable method for completely removing the lacquer comprises the following steps:

- the lacquer coating is largely removed, for example, by means of acetone or methyl-ethyl ketone,
- the plate is heated to 450° C. in air for 1 hour, so that the residual lacquer which is anchored to the metal layer is burnt,
- the plate is immersed for a short period of time, for example 10 seconds, in an etching bath comprising an aqueous solution of $Ce(NH_4)_2(NO_3)_6$ and perchloric acid.

In this step, the combustion residue is removed from the metal layer. The immersion time is so short that the metal layer is not perceptibly attacked.

The plate is subsequently rinsed in water and dried. At this stage, the plate has been provided with metal tracks, mainly of aluminum, and electrodes, chiefly of aluminium, have also been formed on the walls of the holes.

The invention will be explained in greater detail by means of an exemplary embodiment and a drawing, in which

DETAILED DESCRIPTION OF THE PREFERRED EMBODIMENT

Figure 1A:
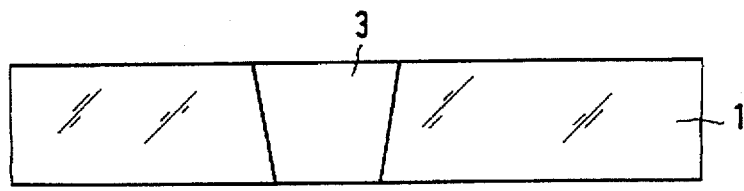
FIGS. 1A to 1G are schematic cross-sectional views of a plate, illustrating the different stages of the method in accordance with the invention.

In FIG. 1A, reference numeral 1 schematically represents a part of a cross-section of a glass plate. Said plate has dimensions of 27×44 cm and a thickness of 0.4 mm. By subjecting the plate to blasting with aluminum-oxide powder, 300,000 conical, circular holes 3 having a maximum diameter of 300 µm and a minimum diameter of 100 µm are formed in said plate. The manner in which said holes are formed is described in the above-mentioned European Patent Application EP-A-562670. To remove any small aluminium-oxide particles, the plate is immersed in an aqueous solution of 2% HF for 2 minutes. The plate is subsequently rinsed with water and dried.

Figure 1B:
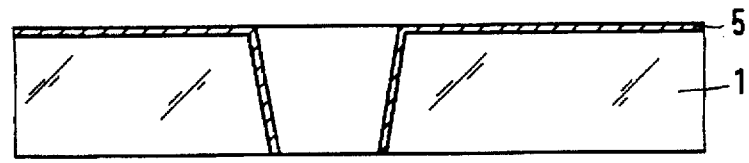

In a vapour deposition system, the plate is provided with a metal multilayer 5 (FIG. 1B) of, in succession, a first chromium layer having a thickness of 10 nm, an aluminium layer having a thickness of 5 µm and a second chromium layer having a thickness of 50 nm. For the sake of simplicity, the three metal layers are not individually represented in FIG. 1B, but as one layer 5. In this example, only one side of the plate is coated with a metal layer 5 and by virtue of the conical shape, also the walls of the holes 3 are internally provided with the metal layer.

Figure 1C:
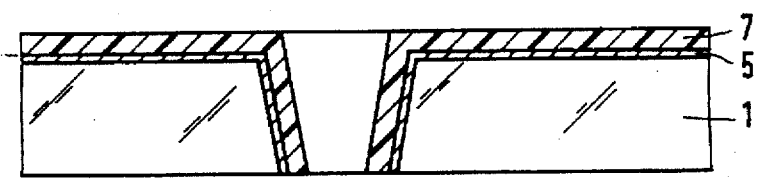

The metallized plate is immersed in EAGLE™ negative, photosensitive cataphoretic lacquer (sold by Shipley Company Inc.) dissolved in water. The lacquer comprises an organic polymer with alkaline amino groups which are neutralized by a water-soluble organic carboxylic acid, thereby forming a stable micro-emulsion comprising micelles having dimensions of 100 nm. Said micelles are positively charged and are stabilized by an electrical double layer. The temperature of the lacquer is 35° C. The metal layer 5 is used as the cathode and a plate of stainless steel is used as the anode. A DC voltage of 100 V is applied between the anode and the cathode. Initially, the current intensity is 2 A. The positively charged micelles migrate towards the cathode. At the cathode, electrolysis of water takes place, resulting in the formation of hydrogen and hydroxy ions. As a result of the alkaline medium formed, the charge on the micelles is neutralized, causing said micelles to coalesce into a layer on the cathode. The organic layer formed is electrically insulating, so that the current through the bath decreases to substantially zero with time. The plate is rinsed with water and dried at 30° C. A lacquer coating 7 (FIG. 1C) having a thickness of 25 µm has then been formed on the metal layer 5. By virtue of the cataphoretic process, the lacquer coating 7 is deposited in a uniform thickness on the plate and in the holes. Said lacquer coating 7 may optionally be provided with a top coating (not shown) by immersing the plate in an aqueous EAGLE™ 2002 (Shipley Company Inc.) solution. This solution comprises cellulose. By virtue thereof, the stickiness of the lacquer coating is reduced. The plate is subsequently dried at 80° C.

Figure 1D:
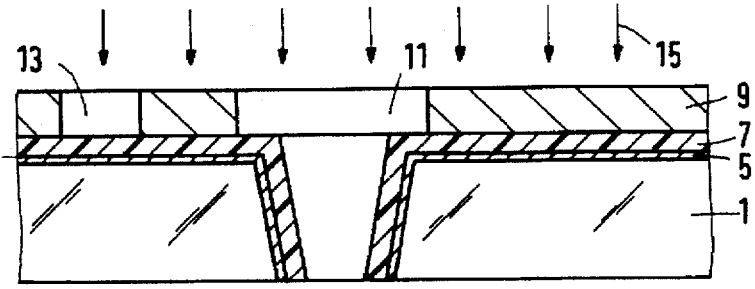

A photomask 9 (FIG. 1D), such as a glass plate provided with a chromium or $Fe_2O_3$ pattern, is placed on the lacquer coating 7. Said photomask comprises transparent portions 11 which are slightly larger than the holes 3 and transparent portions 13 which coincide with the portions of the metal layer to be provided with metal tracks. Arrows 15 denote UV-light originating from a mercury-vapour lamp. This lamp emits light having a wavelength of 365 nm. The exposure dose is 2000 mJ/cm$^2$. In the exposed areas of the lacquer coating 7 a cross-linked polymer is formed which is only slightly soluble in a developing liquid.

Figure 1E:
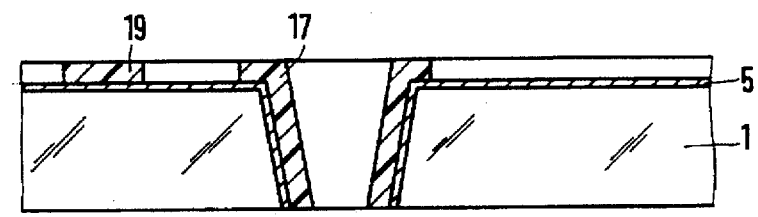

The lacquer coating 7 is developed by immersing it in an aqueous solution of EAGLE™ DEVELOPER 2005 (Shipley Company Inc.) on the basis of lactic acid, whereafter it is rinsed with water and dried. The unexposed portions of the lacquer coating are removed from the metal layer 5. A lacquer coating 17 remains on the metal layer in and around the holes (FIG. 1E). A lacquer coating 19 also remains in places where conductive metal tracks are to be provided.

Figure 1F:
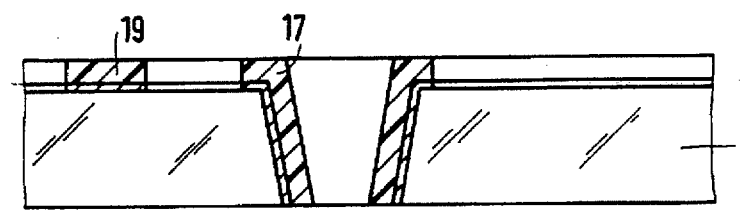

The uncovered metal multilayer of chromium, aluminum and chromium is etched in an aqueous solution comprising 330 g $K_3Fe(CN)_6$, 16 g NaOH and 30 g $Na_3PO_4$ per liter (FIG. 1F).

Figure 1G:
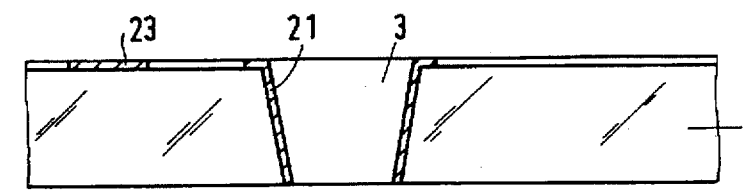

The exposed lacquer coating is stripped off by immersing the plate in acetone. After rinsing with water and drying, the plate is heated in air to 450° C. (FIG. 1G). The combustion residue is removed from the metal layer by immersing the plate for 10 seconds in an aqueous solution comprising 164.5 g $Ce(NH_4)_2(NO_3)_6$ and 43 ml perchloric acid per liter. These treatments result in the lacquer coating being removed without residue. The plate is subsequently rinsed with water and dried. At this stage, the plate 1 comprises holes 3 which are internally provided with metal electrodes 21 and metal tracks 23.

By means of the method in accordance with the invention, an electrically insulating substrate having many holes is reliably provided with well-conducting metal tracks on the plate and metal electrodes in the holes. The conductive metal used is mainly aluminium. The method can very suitably be used for the manufacture of selection plates and control plates for plasma displays, field-emission displays and thin electron displays.

What is claimed is:

1. A method of photolithographically metallizing at least the walls of holes arranged in accordance with a pattern in a plate of an electrically insulating material, said method comprising:

(a) providing a chromium layer on at least one surface of the plate and on the walls of the holes, (b) providing an aluminum layer on said chromium layer, (c) providing a metal layer of a metal selected from the group consisting of chromium, cobalt, nickel, zirconium and titanium and alloys of at least two of said metals on said aluminum layer, (d) electrophoretically providing a photosensitive, negative electrophoretic lacquer coating on said metal layer, (e) exposing said lacquer coating to radiation in accordance to a pattern to form exposed and unexposed portions of said lacquer coating, said exposed portions being formed at least in the holes, (f) developing said lacquer coating so as to remove said unexposed portions of said lacquer coating and uncover portions of said metal layer present underneath said unexposed portions of said lacquer coating, (g) removing, by etching, said uncovered portions of said metal layer and underlying portions of said aluminum and chromium layers while preserving said exposed portions of said lacquer coating and portions of said chromium, aluminum and metal layers underlying said exposed portions of said lacquer coating and (h) stripping said exposed portions of said lacquer coating from portions of said metal layer underlying said exposed portions of said lacquer coating.

2. The method as claimed in claim 1, wherein at least one of the chromium and aluminum layers is provided by vacuum evaporation.

3. The method as claimed in claim 1, wherein the metal layer used is a chromium layer.

4. The method as claimed in claim 1, wherein a UV-sensitive, electrophoretic lacquer coating is used.

5. The method as claimed in claim 1, wherein patterned exposure is carried out by means of a mask.

6. The method of claim 5, wherein the mask is used on the lacquer coating.

7. The method of claim 5, wherein the mask is used out of contact with the lacquer coating.

8. The method as claimed in claim 1, wherein a selection plate for a thin electron display is used as the plate, electrodes being formed from the chromium, aluminum and metal layers on the walls of the holes.

9. The method as claimed in claim 1, wherein glass is used as the electrically insulating material of the plate.

10. The method as claimed in claim 3, wherein the exposed lacquer coating is stripped by treating it with an aqueous solution of $Ce(NH_4)_2(NO_3)_6$ and perchloric acid.

11. The method as claimed in claim 1, wherein at least one of the chromium and aluminum layers is provided by sputtering.

* * * * *